United States Patent [19]
Taff et al.

[11] Patent Number: 6,165,658
[45] Date of Patent: Dec. 26, 2000

[54] NONLINEAR IMAGE DISTORTION CORRECTION IN PRINTED CIRCUIT BOARD MANUFACTURING

[75] Inventors: Itzhak Taff, Yavne; Yossef Atiya, Maccabim, both of Israel

[73] Assignee: Creo Ltd., Israel

[21] Appl. No.: 09/347,775

[22] Filed: Jul. 6, 1999

[51] Int. Cl.⁷ ........................................................ G03F 9/00
[52] U.S. Cl. .............................................. 430/30; 430/320
[58] Field of Search ............................. 430/30, 320, 311

[56] References Cited

U.S. PATENT DOCUMENTS

| | | | |
|---|---|---|---|
| 5,403,684 | 4/1995 | Schroeder et al. | 430/5 |
| 5,506,793 | 4/1996 | Straayer et al. | 364/371.01 |
| 5,548,372 | 8/1996 | Schroeder et al. | 355/53 |

*Primary Examiner*—Christopher G. Young
*Attorney, Agent, or Firm*—Mark A. Litman & Associates, P.A.

[57] ABSTRACT

The present invention relates to a process for the fabrication of multilayer articles having electrical connections between conductor patterns on at least two layers of the multilayer article. The process comprises at least the steps of:

a) using an initial set of image data describing a first article or layer having a conductor pattern thereon, forming the first article or layer having a pattern of conductive material thereon; b) taking data of an image of the pattern of conductive material on the first article or layer; c) determining from the image of the pattern of conductive material on the first article or layer the relative location of sites within the pattern of conductive material on said first article or layer that are to be connected to sites on a pattern of conductive material on at least a second layer having conductor patterns thereon; and thereafter performing steps selected from the group consisting of:

I) modifying the initial set of image data for the first article or layer to make corrections for each conductive site within the pattern of conductive material and producing a corrected set of image data;

II) modifying an initial set of data for at least a second layer having sites within a pattern of conductive material that are to be connected to sites on the first article or layer, said modifying be based upon a comparison of the initial set of image data for the second layer and image data taken in step b) of said first article or layer, and producing a corrected set of image data for the second layer;

III) modifying an initial set of data for a second layer having sites within a pattern of conductive material that are to be connected to sites on another layer, the modifying be based upon a comparison of the initial set of image data for the second layer and image data taken of a manufactured second layer, and modifying the initial set of image data for the first article or layer to make corrections for each conductive site within the pattern of conductive material, thereby producing a corrected set of data for at least the first article or layer and the second layer; and IV) modifying an initial set of data for a number of layers, each layer having sites within a pattern of conductive material that are to be connected to sites on another layer, the modifying being based upon a comparison of initial sets of image data for each of the number of layers and image data taken of a manufactured layer for each of the number of layers, and modifying the initial set of image data for each of the number of layers to make corrections for each conductive site within a pattern of conductive material within each of the number of layers, thereby producing a corrected set of image data for each of the number of layers; and then manufacturing at least one layer having conductive sites therein using a corrected set of data for manufacturing the at least one layer.

17 Claims, 7 Drawing Sheets

NONLINEAR IMAGE DISTORTION CORRECTION IN PRINTED CIRCUIT BOARD MANUFACTURING

BACKGROUND

1. Field of the Invention

The present invention relates to materials, apparatus and processes used in the manufacture of printed circuit boards. The invention particularly relates to the improvement in registration between layers within multi-layer printed circuit boards (PCB's) by novel methods and apparatus. In greater particularity, the present invention relates to improved methods and apparatus for the correction of conductor feature placement error in the fabrication of PCB inner layers. In particular, the invention relates to processes and apparatus which improves inter-layer registration and thereby also improves manufacturing yields.

2. Background of the Art

Multi-layer printed circuit boards (multi-layer PCB's) are one of the most common forms of electronic interconnection means. Multi-layer PCB's may be manufactured by stacking up to twenty (20) or thirty (30) layers (each layer is referred to as an inner layer). Each of the inner layers has its own, previously generated conductor or electronics pattern. The electronics pattern in each of the layers may eventually be electrically connected to the electronics pattern in another layer (not necessarily an adjacent layer) by an interlayer connection, such as a pin, post or, by way of a hole (e.g., a conductive metal plated hole used to interconnect given pads between two or more layers), or any other conductive element that passes from an inner layer to another inner layer, from one conductor site to another conductor site. One of the major difficulties in the manufacture of multi-layer PCB's is the need to match or register the conductor traces or the conductor sites of inner layers which are to be electrically connected. The general field of this problem is referred to as inner-layer registration.

The registration problem may involve general misalignment of the entire conductor pattern, lack of registration of individual elements in the conductor pattern, misregistration of conductive pads, and insufficient registration of conductive sites (e.g., often referred to as pads) within the pattern. In actuality, although is not believed to have been specifically identified before the present invention, the lack of registration of conductor sites (the actual points within the conductor pattern which are to be connected to other conductor sites in other inner layers) is the primary problem in inner-layer registration. If the entire conductor pattern of two inner layers to be connected were out of alignment, except for the conductor sites, no correction would be necessary. If only the conductor sites within a pattern were out of alignment, but all other elements were in perfect register, the lack of registration would not be tolerable, and the interlayer connection of the conductor patterns would be likely to fail.

Registration between layers in a multi-layer PCB has been approached in many ways. A good summary of the error sources and their effects associated with multi-layer registration is given in the article *Inner-layer registration error— causes, effect & cure* by Tom Paur of American Testing Corporation.

This article discusses, among other issues, contributors, which affect the process control for the PCB fabricator. According to this article, there are five process variables that contribute more than 90% of all registration problems:

1. Growth/shrinkage of core material during fabrication.
2. Artwork—plotter out of size or square and film instability.
3. Image transfer—punching error or side-to-side alignment error.
4. Skew during lamination—"squish."
5. Drilling error.

The two largest factors from this group are material growth/shrinkage, which typically contributes more than half of the total error, and artwork error. The rest of the error is distributed between the remaining factors. These factors will vary somewhat from shop to shop depending on the type of equipment, processes and process control, but they are reasonably consistent across the industry.

Further the said article discusses ways of dealing with material growth/shrinkage. Material growth/shrinkage is the most significant factor in registration control. It is also the easiest to identify, measure and control. The process variables that affect material growth/shrinkage include:

Type of material construction (thickness of material and copper, composition of material, weave, amount of resin, direction of weave, etc.).

Processing temperatures and pressures.

Mechanically induced stresses from shearing, scrubbing, punching that may be relieved during subsequent processes.

Amount of copper removed during etch.

The dominant x-y orientation of the remaining copper.

Construction layout of panel, i.e., power/ground on one side of the core, signal on the other side, or signal both sides, or where in the stack a core is located (3–4 versus 5–6, etc.).

| Total Registration Error From All Causes | | |
|---|---|---|
| 60% | 15% | 25% |
| Incorrect compensation (scaling) of artwork for growth/shrinkage of core material during fabrication | All other causes | Artwork error caused by plotter, punching and environmental effects |

According to the article, each of these factors will have a very predictable effect on growth/shrinkage when applied in a given combination, making material movement one of the most manageable of the variables. Being able to identify and manage the specific contribution of each factor to the total error allows the fabricator to dramatically reduce the total registration error.

As can be seen from the cited article and from the following description of inner-layer registration methods, the standard registration error is well understood and dealt with.

Most common inner-layer registration systems can be divided into two major methods: Pre-exposure registration method and post-etch punching registration method. The "pre-exposure" system has been the accepted method for multi-layer registration since the inception of multi-layers.

In a typical "pre-exposure" registration system, layer-to-layer registration is achieved by aligning inner-layer artwork to a drilled master panel (first article) and punching the artwork with the tooling slots or holes. The tooling punched in the artwork matches the tooling that is punched in the inner-layer laminate. The artwork and laminate are pinned together and exposed.

The demand for tighter circuitry on thinner and larger panels brought about the post-etch punch systems to the industry.

The post-etch punching method is described in U.S. Pat. No. 4,829,375 by Alzmann et al. The method includes locating a target on a printed circuit board laminate having a circuit pattern etched thereon and utilizing the target to locate the laminate in a punching device. Two such targets are employed and the laminate is adjusted in the X and Y directions as well as rotationally to bring the target into prescribed relationship with reference markings whereby to locate the holes precisely in the laminate whereby to facilitate stacking of the same. In related apparatus, two television cameras are employed to operate with two targets to feed data into a microprocessor, which generates signals to cause an alignment of the laminate to be punched. With respect to punching mechanisms, special techniques are employed to locate the centers of the targets to that these centers can be aligned with cross hairs to take into account the deviations possible in the configurations of the targets.

Post-etch punching of inner layers offered the following advantages as compared to pre-exposure methods:

The tooling pattern is punched in the inner layer after etching. All material movement resulting from artwork instability, etching, black oxidizing, etc. is compensated for by offset and global scale.

Tooling holes and/or slots that are punched before etching are subject to movement during the etching process. This results in buckling or stretching of the inner layers when pinning on the lamination plates which can cause misregistration. Post-etch punching eliminates this problem, insuring an accurate match between the inner-layer tooling holes and the lamination plates.

Slots and/or holes punched in the laminate prior to etching are subject to copper loss around the tooling. Post-etch punching allows copper to remain around the tooling holes for additional strength during lamination.

Some post-etch machines have the added advantage of providing statistical process control data (SPC). The SPC data shows the difference in mils between the inner-layer targets and the machine-reference targets. This information can be collected and used to evaluate prior processes as well as reaction of different materials. A tolerance window can also be set, specifying a maximum allowable material shift. Inner layers outside this range would either be automatically rejected or could be grouped with layers of similar movements.

Other related prior art are U.S. Pat. Nos. 5,548,372 and 5,403,684 by Schroeder et al. These inventions describe a tooling apparatus designed to provide accurately aligned printed circuits on both major sides of a printed circuit board layer. Another apparatus includes patterns formed on glass masks attached to frames incorporating alignment pins and slots. The patterns include registration marks for alignment during manufacture of the apparatus. During use, the apparatus allows accurate alignment of patterns on both sides of a PCB layer.

Regardless of the method utilized for inner-layer registration, the task of inter-registering the inner layers became increasingly difficult as the average number of layers increased and the conductor feature density became larger.

Looking at the registration task analytically, it can be divided into two categories. The first can be called offset and rotation stack-up errors. Registration error coming from misplacement or misorientation of an inner layer relative to the reference stack-up location. The second category is linear and non-linear scaling errors resulting from the dimensional changes, which the inner-layer panels undergo through the various fabrication processes from imaging through etching and lamination. Both the inherent variations within chemical processing and variations in the imaging process (particularly from edge phenomena or light scattering) can contribute to these errors. While linear scaling error may be characterized by a single correction factor per axis for a given type of layer, non-linear scaling errors require a more complex correction scheme. Starting from second order non-linearity which requires two correction factors through higher degrees of non-linearity, which require a number of correction factors equal to the degree of non-linearity to the most complex case where the required correction factor is as complex as the image file itself.

The widely applied linear scaling error correction, as previously described in the prior art, is generally practiced using experience-based prediction. The shop collects scaling error information for each type of material construction (thickness of material and copper, composition of material, weave, amount of resin, direction of weave, etc.) to build a statistical error database. The measurement of the errors is done on four specifically made tooling targets on each side of the inner-layer panel. Based on this information, a single linear scale correction factor for each of the layer types is determined. This scale factor is then applied to the artwork plotting according to the type of layer, which will be used for the job. The prediction does not always provide adequate correction for complex or sophisticated panels, whereupon a second artwork would have to be prepared after running the first article. This is since the linearity of the dimensional change of the layer depends on the post-etch copper distribution on the layer. The PCB design engineering is therefore required to design the layout of the panel such that it is symmetrical with balanced copper spread to ensure maximum uniform dimensional change so that linear distortion correction only would be sufficient. But some complex designs have too many constraints to conform to this linear scaling rule.

With the conductor features getting finer, and the average number of layers getting higher, the criticality of the correction of non-linear scaling becomes more significant. It is estimated that for feature of 3-mil line/space and smaller, better registration accuracy would be required so the local non-linear distortion would become significant in the registration error budget. Moreover, complex PCB designs do not allow for even distribution of post-etch copper, resulting in non-linear dimensional change. It is estimated that correction of the non-linear error would be mandatory for acceptable yields for such multi-layer board production technologies.

The non-linear scaling error correction presents a tough challenge, since the correction required is location dependent. The more precise the correction needs to be, the more data on the etched layer conductor features would have to be collected. The extreme case would be where the non-linearity is of very high degree, necessitating the geometry of the whole layer to be scanned in. A precise scanning means is not very common in this industry, hence its addition would have cost impact. No wonder why such correction algorithm has never been applied so far. Its application was too complex and expensive, while the errors were not critical for the work that has been done so far.

The tools commonly used today in PCB shops to determine the linear scale errors are the four CCD cameras in the post-etch punch system for separate layers, and the X-ray system for boards after lamination. All those tools are aimed to check for linear scale errors only, since they can only measure a limited number of points on the layer being measured. Few papers published by large PCB manufacturers refer to linear error correction. The reports from these companies also mention the etch and lamination errors as the most significant error of all the process stages.

SUMMARY OF THE INVENTION

Inner-layer registration between layers with individual conductive patterns is improved by the use of an inventive method and apparatus according to the present invention. An actual conductor pattern (produced from an initial map or stored image data, and produced by a defined process on defined apparatus) on at least one inner layer (artificially termed "a first inner layer," even though it does not have to be the first layer) is scanned by an image scanner to produce a scanned map or scanned image data. The information from the scanned image of the first inner layer includes either the entire pattern of the conductor pattern, substantially all areas of the conductor pattern which contain conductor sites, or a segmented (discontinuous) pattern identifying the location of all conductor sites in the first inner layer, or a preselected portion of conductor sites. This information may be treated in a number of different ways, including, but not limited to:

a) comparing the scanned map to the initial map for that layer and creating an error or deviation vector map from a comparison between the initial map and the scanned map, and then correcting the initial map to an adjusted map, the adjusted map being altered to correct the deviations identified in the comparison between the initial map and the scanned map, so that a next first inner layer made by the defined process on the defined apparatus will produce a conductor pattern having less deviation of location of conductor sites thereon;

b) producing an initial set of at least two layers to be formed into a multilayer PCB, comprising a first and second layer made by a defined process on a defined apparatus (artificially termed "a first inner layer" and "a second inner layer," even though each layer does not have to be the first or second layer in any particular direction within the PCB); comparing the initial maps of only one of the first and second layers with only one of the scanned map of the first and second layers respectively, and then correcting the initial maps of only one of the first and second layers to form an adjusted map of only one of the first and second layers, the adjusted map being altered to correct deviations identified in the comparison between the initial map of only one of the first and second layer and the scanned map of only one of the first and second layer, so that a next first inner layer and a next second inner layer made by the defined process on the defined apparatus will produce a conductor pattern having less deviation of location of conductor sites as between the next first and second layers;

c) producing an initial set of at least two layers to be formed into a multilayer PCB, comprising a first and second layer made by a defined process on a defined apparatus (artificially termed "a first inner layer" and "a second inner layer," even though each layer does not have to be the first or second layer in any particular direction within the PCB); comparing the initial maps of each of the first and second layers with the scanned map of the first and second layers respectively, and then correcting the initial maps of the first and second layers to adjusted maps of the first and second layers, the adjusted maps being altered to correct deviations identified in the comparison between the initial maps and the scanned maps, so that a next first inner layer and a next second inner layer made by the defined process on the defined apparatus will produce a conductor pattern having less deviation of location of conductor sites thereon. The ability to maintain the sites in register with each other with regard to through holes, posts, and other linear or vertical features is extremely important in the manufacture of these circuits;

d) producing an initial set of an entire number of inner layers to be formed into a multilayer PCB, comprising an entire number of layers made by a defined process on a defined apparatus; comparing the initial maps of each of the entire number of inner layers with the scanned maps of the entire number of inner layers, respectively, and then correcting the initial maps of the entire number of inner layers, the adjusted maps being altered to correct deviations identified in the comparison between the initial maps and the scanned maps, so that each of the next entire number of inner layers made by the defined process on the defined apparatus will produce a conductor pattern having less deviation of location of conductor sites between adjacent layers;

e) scanning a laminated multilayer printed circuit board to develop an image of the arrangement of at least two inner layers within the PCB. Using the x-ray image (which may be digitized for compatibility with a digital imaging system) to provide an image (data set of an image) of the inner layer features (e.g., the nubs, electrical or electronic features or electrical contact points) after the at least two inner layers have been laminated, enabling compensation for the next layer(s) or for re-registration of the next set(s) of the inner layers in the imaged laminate; this will allow for compensation in the next set(s) for deformation caused by the lamination process as well. Again, the prior art for this type of x-ray imaging is the reading of only four fiducials (at fixed points within the laminate) and then compensating by a linear scale modification in the outer layer imaging; the present system and process allows for correction of subsequent inner layer imaging to offset any and all errors, including lamination error; and f) repeatedly producing an initial set of an entire number of inner layers to be formed into a multilayer PCB, comprising an entire number of layers made by a defined process on a defined apparatus; comparing the initial maps of each of the entire number of inner layers with the scanned maps of the entire number of inner layers, respectively, on an area-by-area basis (including the actual possibility of a pixel-by-pixel basis); determining the amount and direction of deviations in each area (e.g., even a pixel); comparing the amount and direction and deviation in each area (e.g., pixel) with parameters in the original map at least including:

1) size of features in the initial image (size including length, width and depth), and 2) location of the element on the layer, developing a look-up table associating the amount and direction of deviations in the pixels with said parameters in the initial map; and then correcting subsequent initial maps of the entire number of inner layers with data from the look-up table, so that each of the next entire number of inner layers made by the defined process on the defined apparatus will produce a conductor pattern having less deviation of location of conductor sites between adjacent layers.

DETAILED DESCRIPTION OF THE INVENTION

It is important that there be accurate registration of conductor sites between inner layers which are to be electrically connected. Accuracy and inaccuracy have clear meanings within the practice of the present invention. There is accurate alignment of conductor sites within inner layers which are to be electrically connected, when the layers are overlaid (e.g., the first inner layer over the second inner layer or the second inner layer over the first inner layer, and the alignment of a multiplicity of layers laminated together, with registration between adjacent layers and even non-adjacent layers where electrical connection is to be made, as where a conductive element passes from one layer through a number of layers to make electrical contact with a non-adjacent layer), and the outer edges of both conductor sites lie within or are both intersected by a circular section passing perpendicularly through both first and second inner layers, where the circular section has a diameter which is the same as or less than the diameter of the electrical connecting element to be used to electrically connect the two adjacent inner layers or any other layers which are to be connected. This concept is clearly shown in FIG. 1.

Figure 1:
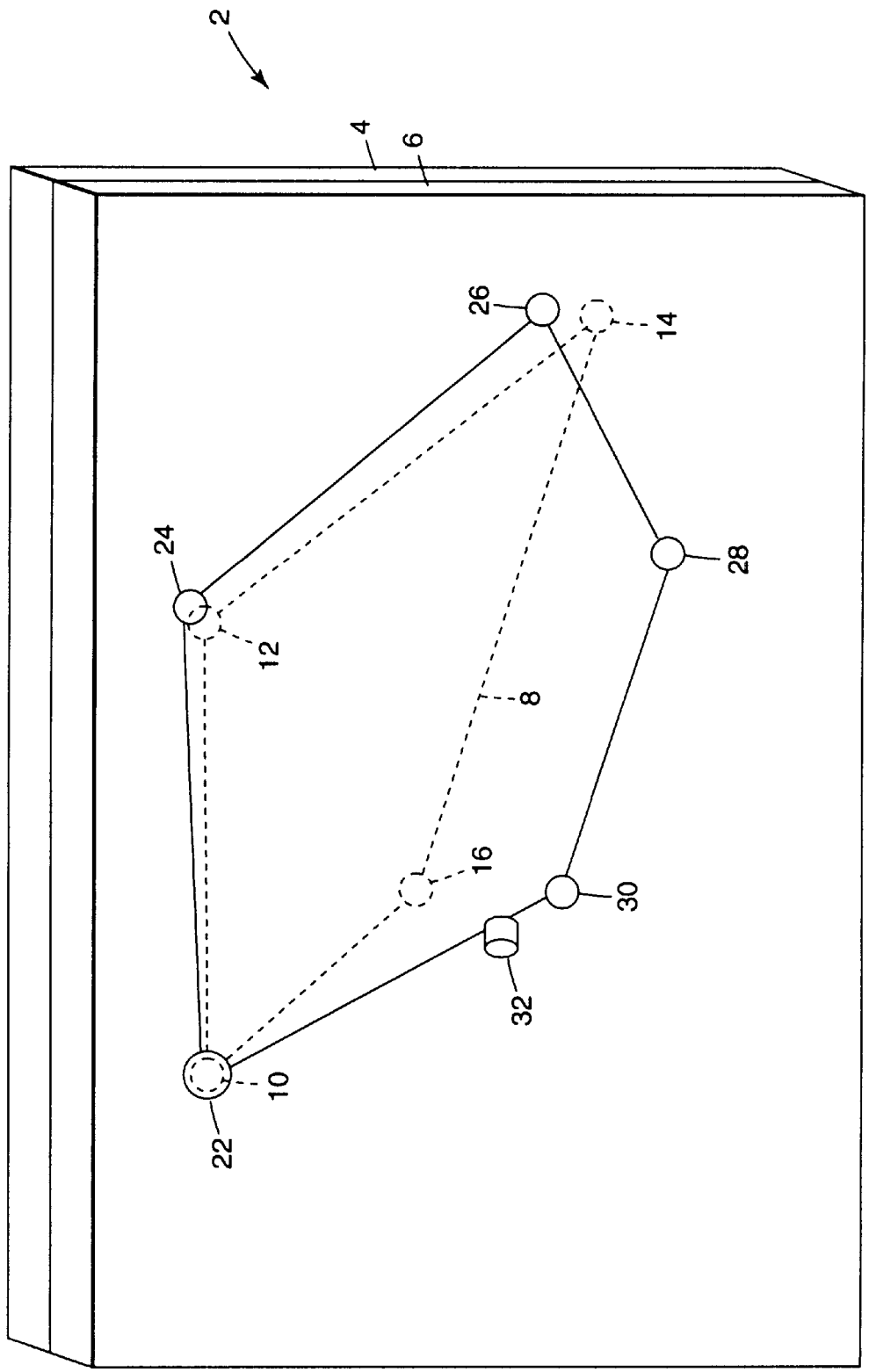
FIG. 1 shows an overhead view of an overlay of two inner layers in a PCB.

FIG. 1 shows two layers of a multi-layer PCB 2 having a first inner layer 4 and a second inner layer 6. The first inner layer 4 has a conductive pattern 8 (shown with dash lines) and four conductive sites 10, 12, 14 and 16. The four conductive sites 10, 12, 14 and 16 are shown with dash lines and are presented in a relatively large size merely for convenience so that the four conductive sites 10, 12, 14 and 16 can be seen relative to other elements in FIG. 1. The second inner layer 6 has a conductive pattern 20 which is shown in solid lines. The conductive pattern 20 is shown with five conductive sites 22, 24, 26, 28 and 30. As exemplified in FIG. 1, conductive site 10 from the first inner layer 4 is in perfect register with conductive site 22 in the second inner layer 6. Any vertical penetration of conductive site 22 by a conductive element (such as a plated through hole, pin or post, not shown) must also pass through conductive site 10 and form an electrical contact. A plated through hole (PTH) is one of the more common methods of providing an interlayer electrical connection, with a hole provided (by drilling, molding, ablation, excavation, etc.) through the layers, intersecting desired areas where an electrical connection is desired, and then with the walls of the hole being plated with a conductive material (e.g., copper) to provide a conductive "post" between the layers. The term "pin" will be generally used to describe this connective, conductive element. Conductive site 12 is not in perfect register with conductive site 24 of the second inner layer 6. However, any post or pin (not shown) centered on conductive site 24 with a diameter which is at least as great as the diameter of conductive site 24 would make electrical contact between conductive sites 24 and 12 by penetrating both the first inner layer 4 and the second inner layer 6. With regard to conductive sites 26 and 14, there is no visual registration between them. That is, a vertical line of sight through conductive site 26 would not overlap (cast a shadow on) conductive site 14. Any pin which was to be used to contact these two conductive sites 14 and 26, must have a diameter at least and most likely larger than the distance between the outer edges of the two conductive sites 14 and 26. Where the registration is this far off, the positioning of the pin or post (not shown) must be more precise, and the size of the pin or post (not shown) must be greater than the distance between the conductive sites 14 and 26. The failure of registration is clearly shown between conductive sites 16 and 30. A pin 32 having a diameter less than the distance between conductive sites 16 and 30 is shown. The pin 32 cannot make electrical contact with conductive sites 16 and 30. This is a failure of registration. Where a specific size pin or post (not shown) has been selected for use with the PCB, accuracy requires that the distance between the outer edges of the shadowed overlay of two conductive sites on different inner layers (the distance being measured along a line overlaying the centers of the two conductive sites) is less than the diameter of the pin or post to be used to pass through the two inner layers and make electrical contact with the two conductive sites on the two inner layers. It is preferred that accuracy is defined as that distance between outer edges of the two conductive sites is less than 50% of the diameter of the post or pin to be used in connecting the two conductive sites. It is more preferred to have an accuracy such as that between conductive sites conductive sites 12 and 24 where there is at least virtual contact between edges the two conductive sites. It is more preferred to have an accuracy such as that between conductive sites 12 and 24 in the shadow overlay of those two conductive sites. It is more preferred that there be registry between the two conductive sites as between conductive sites 10 and 22. Here, if any pin or post passes through conductive site 22, electrical contact must be made with conductive site 10. This is effected where the overlay shadow view of two conductive sites causes the center of one conductive site to lie within the circumference of the other conductive site.

Where there are buried vias (the term refers to holes in the inner layer(s) prior to lamination), the image data may be scanned in with respect to the drilled hole (or holes manufactured by any other method) locations of a "first article" inner layer, and then the corrections may be applied for the subsequent imaging (the data base used for generation of that inner layer) of the same layer to match the drilling (or making corrections in the next layer to match the holes drilled). This can be accomplished with conventional scanning apparatus. The surface of the inner layer is scanned (either directly on its surface or even through another transparent layer) to obtain data (usually digital data) defining the structure and topography of the first layer. The actually scanned data can be compared to the specification sheet or original data that was used in the manufacture of that particular inner layer to determine the nature and scope of variations from the intended location of the hole with respect to the other structure in that inner layer. That data can then be compared with the data to be used in the construction of the next down or other interrelated layer. The data to be used in the construction of the next down or other interrelated layer may then be modified to correct for the deviations in the actual pattern and location of artifacts in the first inner layer so that registry between essential elements is effected.

The invention provides a solution to effect precise compensation or correction of non-linear-distortion (which may include areas of linear distortion) which may be generated in the inner layer panels for any reason. It is the correction which is non-linear, in that the corrections applied to the initial map are applied, for example, pixel-to-pixel, rather than using a single multiplier against the entire layer. The practice of the present invention is particularly effective in the fabrication of inner layer boards using direct imaging technology. What is meant by direct imaging technology in the practice of this invention is any means by which an image (e.g., latent image or visible image) is imposed onto a surface or depth of a panel by an external imaging engine to create the conductive pattern (but not necessarily directly forming the conductive materials in that pattern) on or in the inner layer panel. For example, a photoresist layer (positive or negative acting) may be coated onto the surface of the panel, the resist exposed to radiation to which the resist layer is sensitive (e.g., e-beam, ultraviolet radiation, visible radiation, infrared radiation) to create a differentiable image (e.g., differentially soluble in particular solvents or wash solutions, differentially hydrophilic and hydrophobic), and depositing the conductive material within the generated image pattern desired for the conductive material. Conductive patterns may be directly deposited by particles streams from sputtering or vapor deposition. In general any process by which an image is imposed upon the inner layer panel by exposure to radiation and the subsequent or concurrent deposition of conductive material corresponds to the pattern of imaging is a direct imaging technology. Usually the patterning of the conductor on the inner panel is performed by exposing (e.g., direct exposure to the radiation in an imagewise distribution of radiation) a radiation sensitive etch resist composition on the surface of the panel (or a free-standing resist film which can be subsequently transferred and applied to the inner layer panel surface) to radiation to which the resist layer is sensitive. The exposure may be by any focussed or calumniated radiation (e.g., a focussed beam of radiation, a laser beam, a particle stream such as an e-beam stream, and the like). The imaging is done without a stencil or direct screening art work, as that is not easily amenable to practice with the present invention, since a mask would have to be created for each unique second inner layer imaging process. Scanned imaging of the second inner layer pattern is particularly compatible with the process and apparatus of the present invention. Scanned imaging (either focussed radiation, laser radiation or focussed laser radiation) is particularly useful because of the speed of the imaging, its precision, its utility with a wide variety of resist or deposition systems, the short turnaround time in the creation of new exposure patterns for the second inner layer. The system and process of the invention is not limited to laser direct imaging (LDI), but may be used in conjunction with any of the many imaging processes used with printed circuit board manufacture, such as for example, flat-bed contact printing using film phototools for conductor printing.

The invention may be generally described in the following terms as a process for the fabrication of multilayer articles having electrical connections between conductor patterns on at least two inner layers of the multilayer article, the process comprising the steps of:

a) using an initial set of image data describing a first article (or first layer, with only the article referred to hereinafter in this description, for convenience) having a conductor pattern thereon, forming said first article having a pattern of conductive material thereon;

b) taking data of an image of the pattern of conductive material on the first article;

c) determining from the image of the pattern of conductive material on the first article the relative location of sites or dedicated features within the pattern of conductive material on the first article that are to be connected to sites on a pattern of conductive material on at least a second article (or layer) having conductor patterns thereon; and thereafter performing steps selected from the group consisting of:

i) modifying the initial set of image data for the first article to make corrections for each conductive site within the pattern of conductive material and producing a corrected set of image data;

ii) modifying an initial set of data for at least a second layer having sites within a pattern of conductive material that are to be connected to sites on the first article, the modifying be based upon a comparison of the initial set of image data for the second layer and image data taken in step b) of the first article, and producing a corrected set of image data for the second layer;

iii) modifying an initial set of data for a second layer having sites within a pattern of conductive material that are to be connected to sites on another layer, the modifying be based upon a comparison of the initial set of image data for the second layer and image data taken of a manufactured second layer, and modifying the initial set of image data for the first article to make corrections for each conductive site within the pattern of conductive material, thereby producing a corrected set of data for at least the first article and the second layer; and iv) modifying an initial set of data for a number of layers, each layer having sites within a pattern of conductive material that are to be connected to sites on another layer, the modifying being based upon a comparison of initial sets of image data for each of the number of layers and image data taken of a manufactured layer for each of the number of layers, and modifying the initial set of image data for each of the number of layers to make corrections for each conductive site within a pattern of conductive material within each of the number of layers, thereby producing a corrected set of image data for each of the number of layers; and then manufacturing at least one layer having conductive sites therein using a corrected set of data for manufacturing the at least one layer.

The process may also be particularly practiced where the step performed comprises:

III) modifying an initial set of data for a second layer having sites within a pattern of conductive material that are to be connected to sites on another layer, said modifying being based upon a comparison of the initial set of image data for said second layer and image data taken of a pattern of conductive material on said second layer manufactured second layer, and modifying the initial set of image data for said first article (again or layer) to make corrections for each conductive site within the pattern of conductive material, said modifying being based upon a comparison of the initial set of image data for said second layer and image data taken of a pattern of conductive material on said manufactured first article thereby producing a corrected set of data for at least said first article and said second layer; and said taking data of an image of the pattern of conductive material on said first article and said second layer is performed by scanning the pattern of conductive material on said first article (or layer) and said second layer.

The process may also be particularly practiced where the step performed comprises:

IV) modifying an initial set of data for a number of layers more than two, each layer having sites within a pattern of conductive material that are to be connected to sites on another layer, said modifying being based upon a comparison of initial sets of image data for each of said number of layers and image data taken of a manufactured layer for each of said number of layers, and modifying the initial set of image data for each of said number of layers to make corrections for each conductive site within a pattern of conductive material within each of said number of layers, thereby producing a corrected set of image data for each of the number of layers, and said image data taken of a manufactured layer for each of said number of layers is performed by scanning the pattern of conductive material on each of said number of layers.

A major alternative way of practicing the process for the fabrication of multilayer articles having electrical connections between conductor patterns on at least two layers of the multilayer article comprises the steps of:

a) using an initial set of image data describing a first (article (or layer) having a conductor pattern thereon, forming the first article (or layer) having a pattern of conductive material thereon by a first process on a first apparatus;

b) scanning the pattern of conductive material on the first article (or layer) to record data regarding the pattern of conductive material on said first article (or layer);

c) determining from the data recorded regarding the pattern of conductive material on the first article (or layer) in comparison with the initial set of image data the relative error in the location of conductive elements within the pattern of conductive material on the first article (or layer) as compared to the initial set of image data; and thereafter amending the initial set of data by accounting for the relative error in the location of conductive elements within the pattern of conductive material on the first article (or layer) as compared to the initial set of image data, thereby producing an amended set of image data for the first article (or layer) which will enable the first process and the first apparatus to manufacture a repeated first article (or layer) from the amended set of data.

This process may effect acquisition of data from layers by scanning the pattern of conductive material on any layer (e.g., the first layer) to record data regarding the pattern of conductive material on any layer, and this may provide a pixel-by-pixel map of each layer.

The effect of this process is that repeated layers (that is subsequently manufactured layers) conform to the initial sets of image data better than the first rendition of manufacture, as evidenced by the data recorded regarding the pattern of conductive material on the first manufactured layer from the initial set of data, and said any repeated layer conforms to the initial set of data at least as well as the data recorded regarding (from the first manufactured layer) the pattern of conductive material on each layer at every point within the pattern of conductive material. This results because the corrections are made at each point within the image, and the corrections, being point-by-point, will not make linear-type "corrections" that would actually introduce error at any point. The process thereby operates so that repeated layers (e.g., repeatedly manufactured first layers) conform to said initial set of image data better than the data recorded regarding the pattern of conductive material on the first manufactured layer (with respect to each of the number of layers), and the repeatedly manufactured layers (e.g., the repeated first layers) conform to the initial set of data at least as well as the data recorded regarding the pattern of conductive material on each layer (including the first layer) at every point within the pattern of conductive material. The process may be effected where at least one amended set of data is formed from a vector file created from comparison of the initial set of image data and the data recorded regarding the pattern of conductive material for a particular layer, and wherein scanning the pattern of conductive material on each of the number of layers is used to record data regarding the pattern of conductive material on each of the number of layers to provides a pixel-by-pixel map of each of the number of layers. The method may use laser direct imaging with the corrected set of image data for each of the number of layers to manufacture copies of each of the number of layers. The method may also be described as using laser direct imaging is used to manufacture said repeated first layer.

One of the attributes of the non-linear present invention as compared to conventional linear corrections can be understood from an appreciation of the difference in the underlying nature of the corrections being made. In traditional linear correction methods, the location of a specific number of specific fixed points on the layer is identified and compared to the actual location of those fixed points on the manufactured article. The deviation between the various points, which tend to be located as points within a rectangle (often as the points of a rectangle), is then measured and compared to provide the linear deviation along the lines between the points. A linear correction factor is then applied to the entire article, usually one factor in each of the horizontal and vertical directions (although a single factor may be used for both), and the original map is linearly altered by the factor. This correction factor erroneously assumes uniform factors of deviations and errors at every point within the inner layer. This would be, in fact, a rare event. This linear correction would be able to correct some errors, but is as likely to create errors where some portions of the inner layer are distorted by the process and other areas of the layer are properly accomplished by the process. This linear correction method is therefore capable of "correcting" perfectly good areas of an inner layer.

The method of the present invention considers at least some and preferably all of the conductive sites or pads on at least one layer, at least some and preferably all of the conductive sites or pads on adjacent layers, at least some and preferably all of the conductive sites or pads on at least some and preferably all of the layers, at least 10% and preferably all of the entire surface (pixel-by-pixel) on at least one layer, at least 10% and preferably all of the entire surface (pixel-by-pixel within the area to be imaged, the edges of the surface of the layer do not have to be scanned, but may be scanned) on at least two adjacent layers, or the entire surface (pixel-by-pixel) on all of the layers on which patterns of interconnected electrical elements are to be formed are considered in the remapping of the initial maps with correction information derived by comparison of the pixel-by-pixel information of a scanned map with pixel-by-pixel information of an initial map. By correcting each map or adjacent maps on an area-by-area basis or even on a pixel-by-pixel basis, accuracy of each set of contacting sites between adjacent layers and/or among all of the layers laminated into the final PCB product is enhanced. This will assure reduced amounts of wastage and increase the efficiency of the overall process. One aspect of the process is to effect a non-linear correction of the entire surface, as would be effected in the prior art by examination of only points that are linearly spaced from each other along perpendicular axes (e.g., the four corners of a square). The present invention allows for the scanning of points or areas that include points or areas that are not necessarily only linearly spaced from each other along perpendicular axes. The scanning may, and preferably does, include points that are so spaced (e.g., a pixel-by-pixel scanning includes all points and all areas), but it is not essential. Furthermore, where only a portion of the surface is scanned and compared, some areas will be used that either do not represent corners or portions of lines within a single rectangle or square so that non-linear corrections may be made.

In the description of the present invention, where the terminology is used such as "made by a defined process on a defined apparatus," it is meant that the first layer or sets of layers were made by a particular (as defined) process, such as direct laser imaging resist exposure, development and deposition of conductive material (or any other specific process useful for providing a conductive distribution of materials or elements in a layer, particularly by focussed imaging on that layer), and that process is performed by a particular apparatus (preferably the same apparatus, but the process may be effective with the same design and manufacturer of an apparatus), the mapping comparison and the deviations found are relatively unique to that process and apparatus. For example, manufacturing the first set of layers with direct laser imaging of a photoresist layer exposing a copper substrate and mapping a vector correction or vector deviation map would not serve a significantly useful purpose if the next set of layers were then to be made by mask exposure of a laminable photoresist layer on a drum which was to be stripped from the drum after exposure, laminated to a substrate, and copper deposited in the exposed areas. The nature of the processes would be so diverse that corrections based on the scanned map of the first article or first layer manufactured would tend to be irrelevant to the potential for errors in any set of layers made by the completely diverse methods and apparatus. The language "made by a defined process on a defined apparatus" therefore reflects the need for substantially similar processes and substantially similar apparatus. The term similarity means at least that the same fundamental mechanisms of operation (e.g., the first set and subsequent sets being manufactured by the same type of exposure, the materials used in the photosensitive layers have similar exposure and development properties, the layers have comparable thicknesses, the exposure parameters (e.g., spot size, fluence, spot shape, pulsed frequency, etc.) are comparable, developing solutions or plating solutions have comparable properties, and the like. It is included within this description that the same process and the same apparatus is being used to make the first set of layers from which scanned maps are made and making subsequent sets of layers. Where the parameters of the process approach identity in the sequential manufacture of sets and the apparatus is identical, the effectiveness of the process of the present invention is maximized.

As will be described more particularly below, the invention is generally useful for controlling a processing operation to be performed on a workpiece in order to eliminate or reduce certain registration errors, particularly those arising when the workpiece is mounted on the processing machine. These errors may relate to any feature that is designed into the overlain structure or layered structure, including, but not limited to holes, plated holes, plating, pins, through-holes, topography, in-lays, inlaid circuitry, trenches, mounds, fitted surfaces, and the like. The majority of the description herein of holes, pins and circuitry is intended to be illustrative only, and is not intended to limit the broad applicability of the practice of this technology. Where the narrower specific terms are used, they are used in an exemplary purpose, and the design and practice of the invention should be understood to be broadly reflected upon the entire field, not those limited examples. The invention is specially useful for reducing or eliminating registration errors when plotting or printing an image on a substrate, such as an inner layer of a printed circuit board, mounted on the external (or internal) surface of a rotary-drum or flat-bed imaging machine; and therefore the invention is described below with respect to this particular application. Generally, however, the invention relates to the use of a process for scanning a first surface of a first layer with features thereon (e.g., hole array, plated hole array, through-hole array, etc.), comparing the scanned array with a reference file (e.g., data, program, manufacturing specifications, imaging file, etc.) and calculating the deviations between the scanned array with the reference file; and then correcting a respective image that is to be used in the preparation of a second layer with features in the second layer that are to be provided in registry with at least some features in the first layer. The image used in the manufacture of the second layer may correspond to the data of location or design for any features, such as conductor pads, pins, through-holes, plated holes, circuitry, wires, or the like. The process may also be used in conjunction with correction of hole drilling in subsequent first surfaces.

FIGS. 2–6 illustrate one form of imaging machine of this type, namely a laser direct imaging (LDI) machine which plots (or prints) separate images from separate files on both sides of an inner layer of a PCB (printed circuit board), similar to the pre-press imaging apparatus manufactured by Creo Products Inc., of Canada. Such machines can handle one layer at a time, or two layers simultaneously. The one or two layers are manually or automatically loaded on the machine with one side facing upwardly, whereupon the machine plots the file suitable for that side on the one or two layers. The layers are then manually or automatically inverted such that the other side faces upwardly, whereupon the machine plots the file suitable for the second side. After both sides have thus been printed, the layers are unloaded.

The method and apparatus described below enable achieving the following two major objectives: (1) to plot the image on each side of the layer in a correct geometry such that the resulting image will resemble the file upon which it was created in respect of geometrical shape and scale, irrespective of variation in the thickness or the length of the layer, or the alignment of the layer with respect to the machine; and (2) to plot the images on the two sides of the layer such that they will register with each other.

Figure 2:
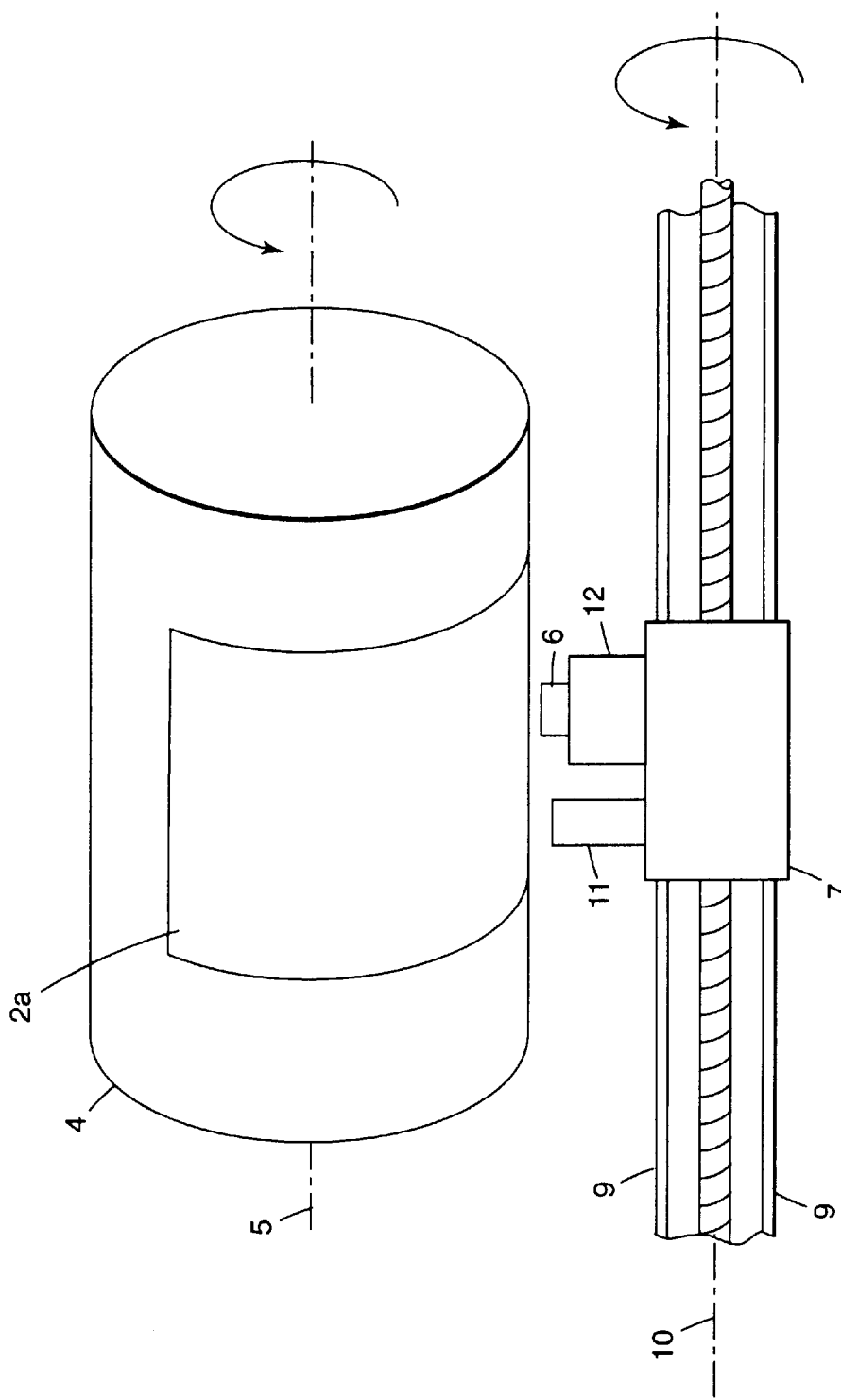
FIG. 2 is a top view schematically illustrating one form of processing apparatus, namely an imaging or plotting machine, constructed in accordance with the present invention.
Figure 3:
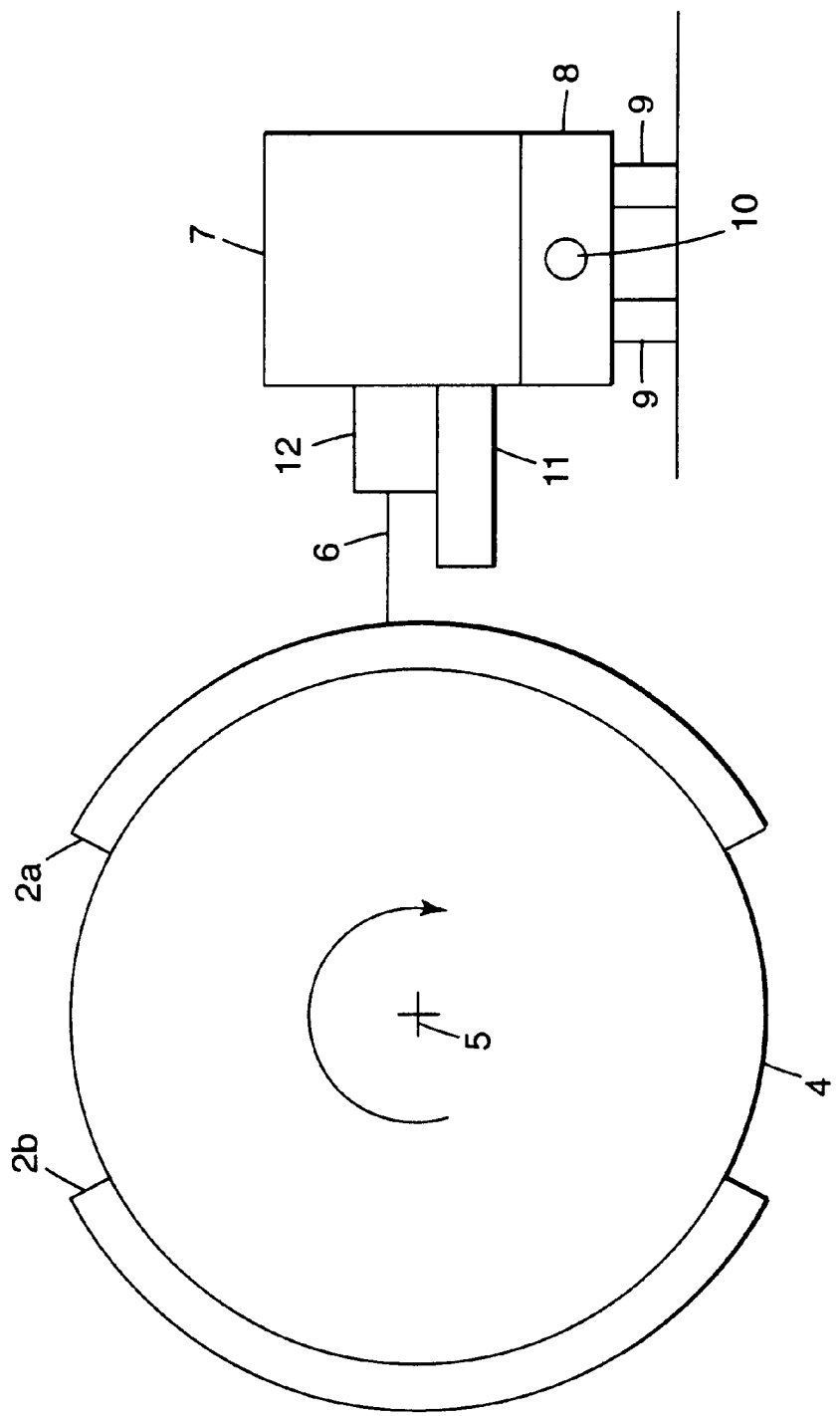
FIG. 3 is a side view of the apparatus of FIG. 2.
Figure 4:
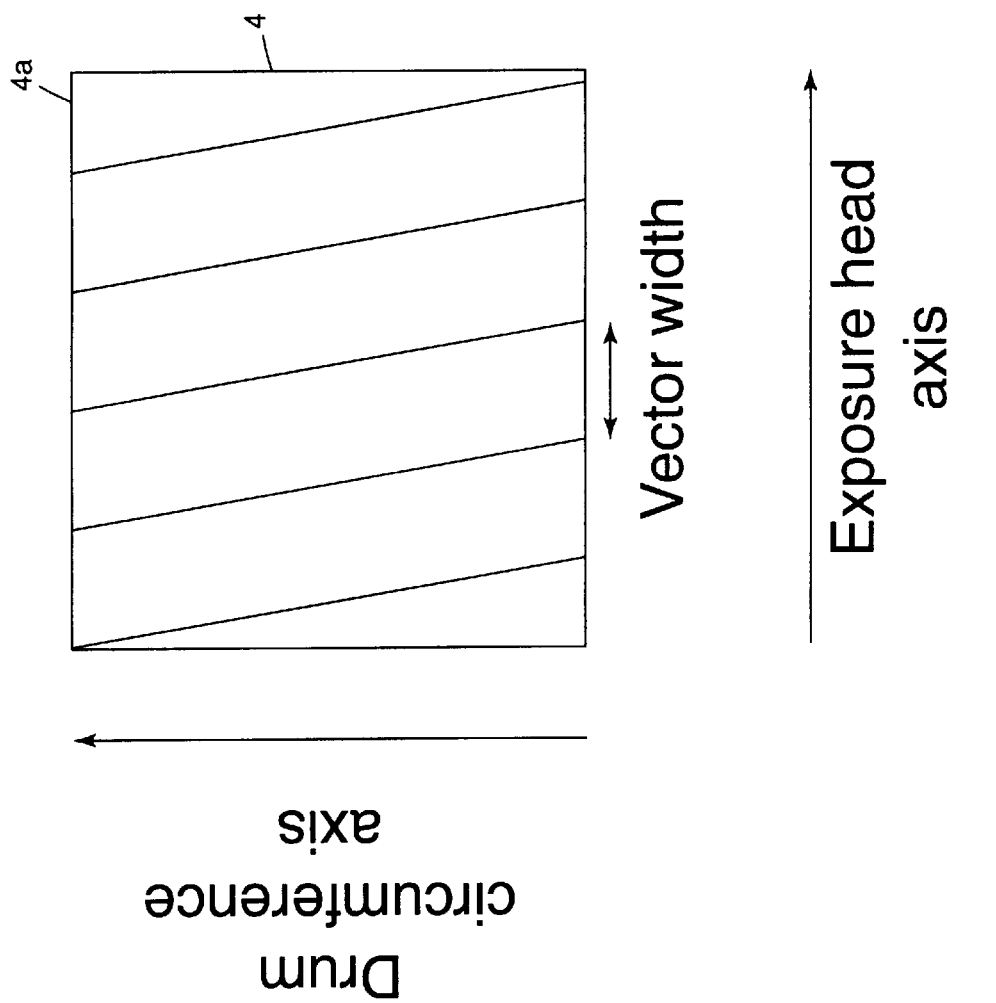
FIG. 4 illustrates the area scanning pattern in the apparatus of FIGS. 2 and 3.

FIGS. 2 and 3 illustrate two such layers 2a, 2b, mounted in any conventional manner on a cylindrical drum 4 rotatable about a rotary axis 5. Each layer 2a, 2b, has a resist-coated outer surface to be exposed to the laser beams produced by a linear array of lasers 6 carried by a plotting or printing exposure head 7. Each laser defines a pixel of the image to be printed on the layers 2a, 2b, and is on-off controlled according to the respective image file.

The exposure head 7 is mounted on a flat carriage 8 which moves along tracks 9, by rotating screw 10, parallel to the rotary axis 5 of the drum 4. The lasers 6 are arranged in a linear array also parallel to the drum rotary axis 5, such that the rotation of the drum, and the linear movement of the exposure head 7, cause the laser beams to scan the complete area of each layer 2a, 2b, in the form of parallel inclined bands as shown at 4a in FIG. 4.

A sensing device, in the form of an electronic camera 11, is fixed to the exposure head 7 so that it moves with the exposure head. Camera 11 has a field of view which covers only a relatively small portion of the surface of the layers 2a, 2b in order to provide high resolution in a relatively compact camera. The camera is fixed to the exposure head 7 such that a reference point of the camera field of view is at a known location with respect to a reference point of the exposure head 7, and thereby of the lasers 6 producing the laser writing beams. As will be described more particularly below, the camera is used to snap features on the panel in order to sense reference marks thereon, and thereby to determine the locations of such reference marks in terms of the machine exposure head coordinates.

Exposure head 7 further carries an autofocus device 12. This device measures the distance between the exposure head and the outer surface of the layer, by means well known in the art, in order to keep the printing laser beams in focus with the layer outer surface. However, as will also be described more particularly below, autofocus device 12 is also used, according to another aspect of the present invention, for continuously measuring the thickness of the layer 2a, 2b, and for continuously controlling the lasers 6 to compensate for geometrical distortions resulting from variations in layer thickness.

Figure 5:
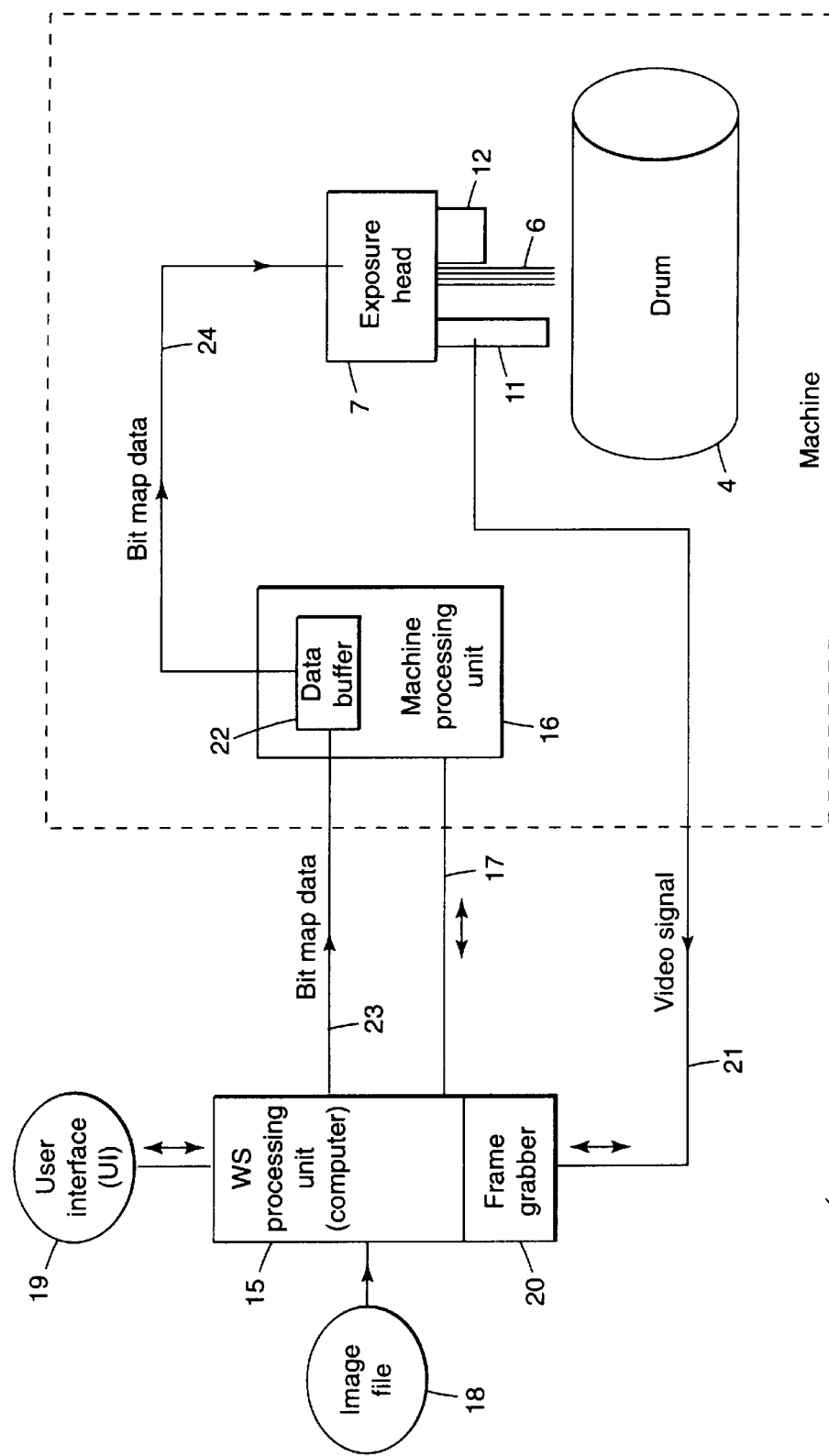
FIG. 5 schematically illustrates the electrical system for controlling the apparatus of FIGS. 2 and 3.

As shown in FIG. 5, the electrical system includes two main processing units: a workstation (WS) processor 15 located in the workstation outside of the imager; and an imager processor 16 located on the imager. The two processors communicate with each other via a two-directional path 17.

Figure 6:
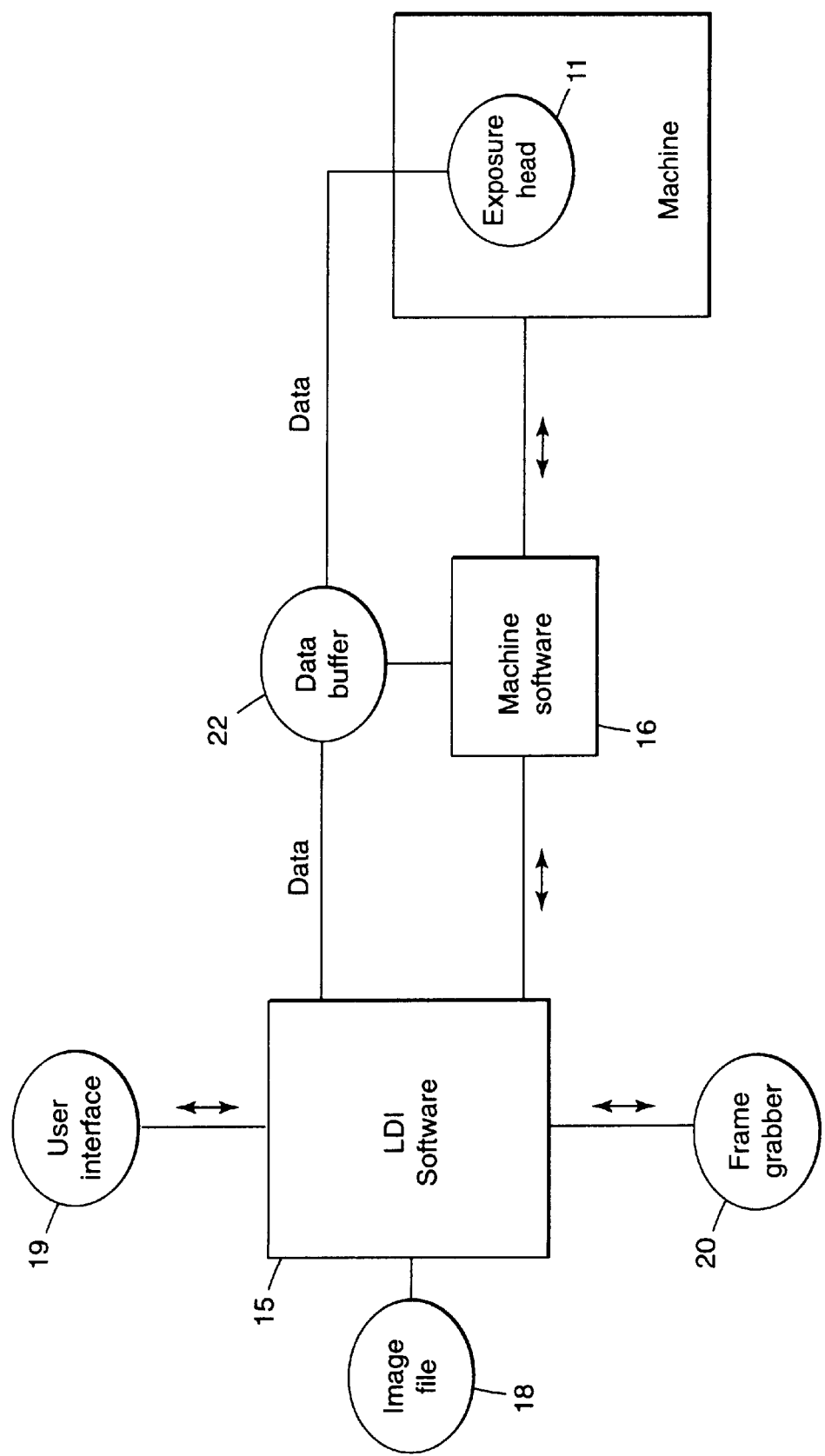
FIG. 6 is a block diagram illustrating the data flow in the apparatus of FIG. 5.

WS processor 15 is the main control unit. As shown in FIGS. 5 and 6, WS processor 15 receives inputs form the image file 18 and the user interface 19, and controls the lasers 6 and the camera 11 carried by the exposure head 7 in accordance with these inputs. A frame grabber 20 within the WS processor 15 grabs the video signal frame from camera 11 received via line 21, and converts it to a graphic file.

As will be described more particularly below, the WS processor 15 identifies certain features in the grabbed frame, and calculates the geometrical corrections that are to be applied on the electronic image (i.e., the electronic representation of the image) from the image file 18. These corrections are sent to the imager processor 16, which performs the appropriate electronic and data manipulations on the electronic image to correct for misregistration in the layers 2a, 2b.

The imager processor 16 includes a data buffer 22 which receives the data from the WS processor 15. A graphic file of a given format is converted in the WS processor 15 to a bit-map file, and is sent through a dedicated path 23 to the data buffer 22 of the imager processor 16. Data is sent from a suitable location in data buffer 22 via path 24 to the exposure head 7 to control the plotting lasers 6.

As shown particularly in FIG. 6, the workstation (WS) operations are governed by the LDI (Laser Direct Imaging) software within the WS processor 15; and the actions of the lasers 6 carried by the exposure head 7 are governed by the imager processor 16, which processor also receives feedback from the exposure head.

Figure 7:
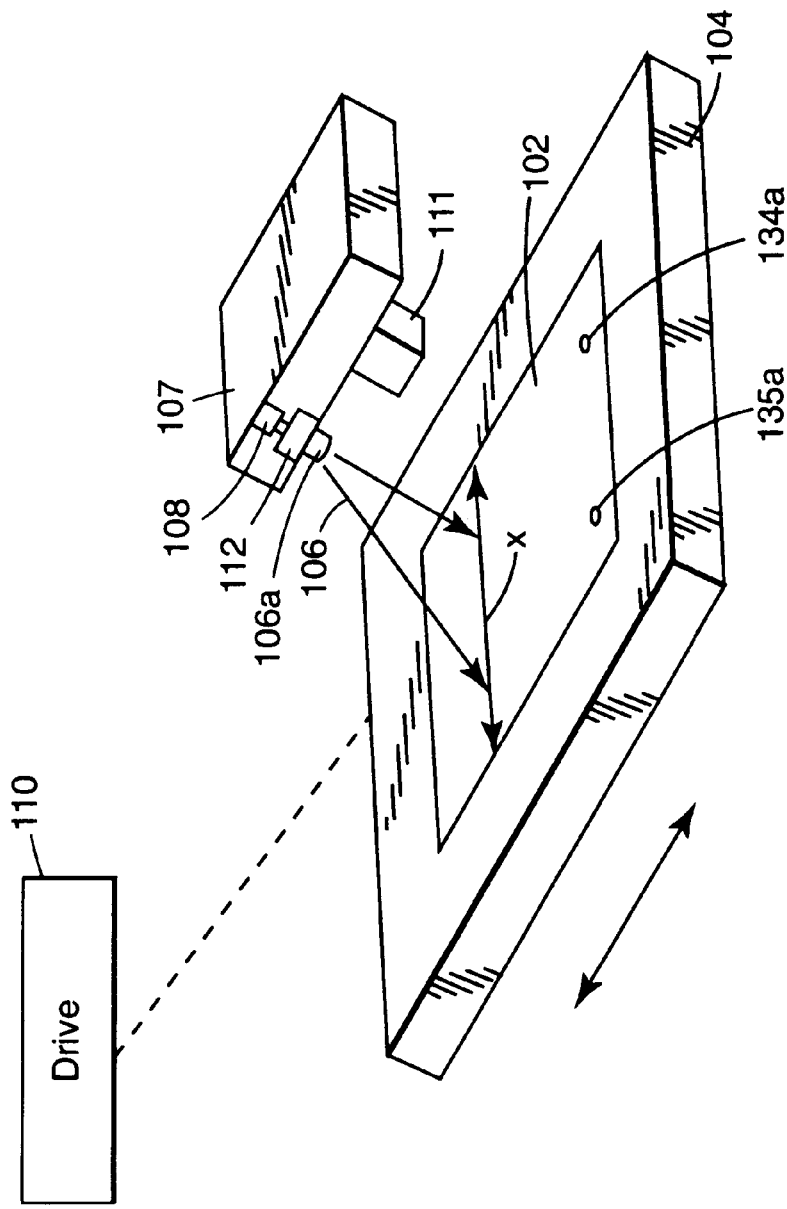
FIG. 7 illustrates a method according to the present invention applied to a flat-bed imaging or printing machine for reducing or eliminating registration errors in accordance with the present invention.

FIG. 7 illustrates a second form of imaging machine of the type including a flat-bed 104 for receiving the substrate layer 102 on which an image is to be plotted by one or more lasers 106 carried by a plotting or exposure head 107. In this example, the flat-bed 104 is driven by a drive 110 along the Y-axis, and the laser beam 106 is deflected along the X-axis by a rotatable polygon and mirror assembly 108. The exposure head 107 also carries a camera 111 and an autofocus device 112, corresponding to camera 11 and autofocus device 12 in FIGS. 2 and 3.

Among the various formats of practicing the present invention is included a process wherein the actually scanned image pattern of the first inner layer is then compared with an image or data pattern of at least a second inner to which the first inner layer is to be electrically connected or to the data pattern of the first and second layer, or to the image pattern (map) of only the first layer. Failure of accurate registration between conductor sites (between layers or within the initial map and the scanned map of a single layer) in the actual structure of the first inner layer and the proposed structure of the second inner layer are evaluated. Where the registration between the conductor sites in the first inner layer and the conductor sites in the second inner layer are inaccurate (inaccurate according to this aspect of the present invention is specifically defined herein), an adjustment is made in the image pattern proposed for the first, second, or first and second inner layer (the proposed conductor pattern and/or location for the conductor sites) to improve the accuracy of registration. The correction may be implemented for the entire first inner layer, second interlayer, or first and second inner layer pattern or for only so many of the conductor sites which are not sufficiently accurately in registration. After the registration of each conductor point in the first, second, or first and second inner layer with each counterpart conductor point in the adjacent layer(s) has been established as within accuracy tolerances, the first, second, or first and second inner layer may be constructed from the adjusted pattern(s) to assure improved inner layer registration.

Alternatively, rather than making a direct comparison of the scanned conductor pattern in the first inner layer to the proposed conductor pattern in the second inner layer, the scanned conductor pattern for the first inner layer may be compared with the original proposed conductor pattern for the first inner layer. The differences between the proposed conductor pattern of the first inner layer and the actual conductor pattern in the first inner layer are noted. The differences between the proposed and actual conductor patterns in the first inner layer are determined, most easily as a vector map showing the direction and displacement of segments of the conductor patterns of the first inner layer and the second inner layer, or more particularly, a vector map showing the direction and displacement of the conductor sites within the conductor patterns of the first inner layer and the second inner layer. The vector map or displacement map of the conductor sites may then be compared to the proposed conductor pattern and/or conductor site locations in the proposed second inner layer, and the map of the proposed second inner layer adjusted to assure registration of the conductor sites in the second inner layer with conductor sites in the actual first inner layer (as represented by the vector displacement map for the first inner layer or the conductor sites of the first inner layer).

An additional step which may be taken in this process is noting consistent or repeated displacements of conductor sites or conductor patterns in the first inner layer (assuming them to be a result of the inaccuracies of the operation of the imaging device used to generate the pattern of conductive elements within the first and/or second inner layer) and compensating in the proposed pattern for the second inner layer or in the pattern of another first layer for the repeated errors in positioning of the image.

The invention is a method for a full compensation of non-linear local distortion errors, suitable for greatly reducing, or eliminating the mis-registration errors common in high layer count, fine feature fabrication of multi-layer PCB. The method comprises of the following major stages:

1. Measuring the location of the conductors of one or more finished inner layer panel, using one of the scanning-in methods described hereafter,
2. Calculating of the correction set (correction file) from the measurement mentioned earlier, relative to a reference image file (CAD reference) using statistical analysis tools if required,
3. Implementation of the correction, by applying it onto the file used for imaging the inner layer, either in vector form, or in pixel based form, depending on the stage where the implementation is most convenient,
4. The application of the correction, by imaging the corrected image file onto the inner layer panels being fabricated. In one embodiment of the invention, the first inner layer (first article) produced for a given inner layer lot is scanned using cameras precisely positioned so as to provide a full distortion of the first article, relative to a reference (CAD reference). From this distortion map, a local distortion vector correction file is generated, which upon application to the LDI vector file, generates the desired corrected conductor pattern. The vector correction file can be made arbitrarily accurate by taking more time or using more stable structure for the layer-scanning fixture.

It is being emphasized that, unlike linear scaling error systems, the scanning system for non-linear correction as contemplated in this invention must be capable of covering the whole layer and provide local errors of the conductor pattern. For this purpose a very precise means of scanning in the layer conductor pattern may be an LDI plotting engine. Being a precise plotting apparatus, it is capable of precisely scanning a previously made conductor pattern. A novel method of scanning in the conductor pattern is to use the focus sensor of the LDI engine to map the conductor pattern. The focus sensor, being capable of discerning minute height differences on a surface being scanned, constitutes a very good conductor pattern scanner.

Measurement Methods

1. Measuring the locations of conductor using a camera mounted on a high precision movement X-Y table
2. Measuring the location of conductors using a non-precisely X-Y moving camera relative to reference grid,
3. Measuring the location of conductors using a non-precisely X-Y moving camera relative to precisely drilled holes,
4. Measuring the location of conductors using a camera mounted on LDI system, wherein the camera movement is achieved by the existing precise X-Y movement axis.
5. Measuring the location of conductors by sensing the height differences between copper and substrate, using for example, the built-in focus sensor in an LDI system. The measurement accuracy is as high as the LDI scanning resolution and coordinates are.
6. Measuring the location of conductors using an apparatus having an array of cameras position in precisely known positions, which field of view covers at least the separation between cameras.
7. Measuring the location of conductors using the readout of an Automatic Optical Inspection (AOI) system.

Calculation of Correction Vector File

1. Fabrication of "first Article" inner layer (running the layer through imaging, developing, etch and strip). Scanning the resulting conductor pattern into a file using one of the methods described above.
2. Running a few inner layer through the process described above, measuring them and generating a conductor pattern file which is the average of the measured results of the said inner layers.
3. Running a Statistical Process Control (SPC) series of inner layers having all the possible combinations of glass epoxy type, copper weight, laminate thickness, etc., in combination with a range of possible conductor patterns having representative copper distribution. Using the data collected to establish data base upon which a corresponding correction vector file can be applied for each combination of laminate and copper distribution.

Implementation of the Correction

1. Using a vector correction file to apply directly on the vector file used at the CAM station input.
2. Applying the correction on the rasterized or ripped (raster image processed) file during the actual imaging, thus enabling application of sub-pixel correction, at least in the main scan direction.
3. A combination of the two said methods wherein the coarse correction is applied in the vector domain, while the fine corrections are applied in the pixel domain where sub-pixel corrections can be implemented.

Application of the Correction

The correction may be applied to produce layers corrected for the non-linear scaling errors in one of the following application methods:

1. Generating the corrected pattern using LDI imaging machine, either flatbed or drum based,
2. Generating the corrected pattern using a film photoplotter to make a corrected film for subsequent contact exposures of the layers,
3. Generating the corrected pattern using imaging onto Direct Write Film (DWF) with the corrected image, which subsequently may be transferred to the inner layer panels being fabricated by contact exposure.

Advantages

Enabling more advanced multi-layer PCB fabrication: Finer features, higher layer count and smaller annular ring can be made while keeping the yields or improving them, Elimination of the constraints of even distribution of copper over the area of the layer, thus enabling better utilization of layer area for more dense and efficient layout, Use of available equipment to collect non-linear conductor de-location data, Using existing feature on LDI systems for precise scan of the conductor placement, With LDI the convergence to correct scaling error correction is considerably faster.

The process described herein has used both generic and specific language in the discussion of features of the invention. Those descriptions, where specific, are not intended to limit the applicability of the invention to a broad range of technology. For example, where processing (e.g., for the provision of holes) is described as performed by photoresist etching, all of the other commercially available technologies for the manufacture of holes, including, but not limited to thermal resist etching, resist etching generally, drilling, ablation, laser ablation, high energy beam ablation, electrical discharge machining, directed vapor deposition, plunge electrical discharge machining, and the like are equally contemplated in the practice of the invention. Each and every one of those alternative methods are amenable to use with maps, reference files, programs and the like for the manufacture of features on a layer that would be desirably in register with features on another layer.

What is claimed:

1. A process for the fabrication of multilayer articles having electrical connections between conductor patterns on at least two layers of the multilayer article, said process comprising the steps of:
   a) using an initial set of image data describing a first layer having a conductor pattern thereon, forming said first layer having a pattern of conductive material thereon;
   b) taking data of an image of the pattern of conductive material on said first layer;
   c) determining from the image of the pattern of conductive material on said first layer the relative location of sites within the pattern of conductive material on said first layer that are to be connected to sites on a pattern of conductive material on at least a second layer having conductor patterns thereon; and thereafter performing steps selected from the group consisting of:
   I) modifying the initial set of image data for said first layer to make corrections for each conductive site within the pattern of conductive material and producing a corrected set of image data;
   II) modifying an initial set of data for at least a second layer having sites within a pattern of conductive material that are to be connected to sites on said first layer, said modifying be based upon a comparison of the initial set of image data for said second layer and image data taken in step b) of said first layer, and producing a corrected set of image data for said second layer;
   III) modifying an initial set of data for a second layer having sites within a pattern of conductive material that are to be connected to sites on another layer, said modifying be based upon a comparison of the initial set of image data for said second layer and image data taken of a manufactured second layer, and modifying the initial set of image data for said first layer to make corrections for each conductive site within the pattern of conductive material, thereby producing a corrected set of data for at least said first layer and said second layer; and
   IV) modifying an initial set of data for a number of layers, each layer having sites within a pattern of conductive material that are to be connected to sites on another layer, said modifying being based upon a comparison of initial sets of image data for each of said number of layers and image data taken of a manufactured layer for each of said number of layers, and modifying the initial set of image data for each of said number of layers to make corrections for each conductive site within a pattern of conductive material within each of said number of layers, thereby producing a corrected set of image data for each of the number of layers; and
then manufacturing at least one layer having conductive sites therein using a corrected set of data for manufacturing said at least one layer.

2. The process of claim 1 wherein the step performed is:
   I) modifying the initial set of image data for said first layer to make corrections for each conductive site within the pattern of conductive material and producing a corrected set of image data, and
said taking data of an image of the pattern of conductive material on said first layer is performed by scanning the pattern of conductive material on said first layer.

3. The process of claim 1 wherein the step performed comprises:
   II) modifying an initial set of data for at least a second layer having sites within a pattern of conductive material that are to be connected to sites on said first layer, said modifying be based upon a comparison of the initial set of image data for said second layer and image data taken in step b) of said first layer, and producing a corrected set of image data for said second layer, and
said taking data of an image of the pattern of conductive material on said first layer is performed by scanning the pattern of conductive material on said first layer.

4. The process of claim 1 wherein the step performed comprises:
   III) modifying an initial set of data for a second layer having sites within a pattern of conductive material that are to be connected to sites on another layer, said modifying being based upon a comparison of the initial set of image data for said second layer and image data taken of a pattern of conductive material on said second layer manufactured second layer, and modifying the initial set of image data for said first layer to make corrections for each conductive site within the pattern of conductive material, said modifying being based upon a comparison of the initial set of image data for said second layer and image data taken of a pattern of conductive material on said manufactured first layer thereby producing a corrected set of data for at least said first layer and said second layer; and
said taking data of an image of the pattern of conductive material on said first layer and said second layer is performed by scanning the pattern of conductive material on said first layer and said second layer.

5. The process of claim 1 wherein the step performed comprises:
   IV) modifying an initial set of data for a number of layers more than two, each layer having sites within a pattern of conductive material that are to be connected to sites on another layer, said modifying being based upon a comparison of initial sets of image data for each of said number of layers and image data taken of a manufactured layer for each of said number of layers, and modifying the initial set of image data for each of said number of layers to make corrections for each conductive site within a pattern of conductive material within each of said number of layers, thereby producing a corrected set of image data for each of the number of layers, and
said image data taken of a manufactured layer for each of said number of layers is performed by scanning the pattern of conductive material on each of said number of layers.

6. A process for the fabrication of multilayer articles having electrical connections between conductor patterns on at least two layers of the multilayer article, said process comprising the steps of:
   a) using an initial set of image data describing a first layer having a conductor pattern thereon, forming said first layer having a pattern of conductive material thereon by a first process on a first apparatus;

b) scanning the pattern of conductive material on said first layer to record data regarding the pattern of conductive material on said first layer;

c) determining from the data recorded regarding the pattern of conductive material on said first layer in comparison with said initial set of image data the relative error in the location of conductive elements within the pattern of conductive material on said first layer as compared to the initial set of image data; and thereafter amending the initial set of data by accounting for the relative error in the location of conductive elements within the pattern of conductive material on said first layer as compared to the initial set of image data, thereby producing an amended set of image data for said first layer which will enable the first process and the first apparatus to manufacture a repeated first layer from said amended set of data.

7. The process of claim 6 wherein scanning the pattern of conductive material on said first layer to record data regarding the pattern of conductive material on said first layer provides a pixel-by-pixel map of said first layer.

8. The process of claim 6 wherein said repeated first layer conforms to said initial set of image data better than said data recorded regarding the pattern of conductive material on said first layer, and said repeated first layer conforms to said initial set of data at least as well as said data recorded regarding the pattern of conductive material on said first layer at every point within the pattern of conductive material.

9. The process of claim 7 wherein said repeated first layer conforms to said initial set of image data better than said data recorded regarding the pattern of conductive material on said first layer, and said repeated first layer conforms to said initial set of data at least as well as said data recorded regarding the pattern of conductive material on said first layer at every point within the pattern of conductive material.

10. The method of claim 1 wherein said at least two layers each comprise inner layers within a multi-layer printed circuit board.

11. The method of claim 4 wherein said at least two layers each comprise inner layers within a multi-layer printed circuit board.

12. The method of claim 5 wherein said each of said number of layers comprise inner layers within a multi-layer printed circuit board.

13. The method of claim 5 wherein at least one amended set of data is formed from a vector file created from comparison of the initial set of image data and the data recorded regarding the pattern of conductive material for a particular layer.

14. The method of claim 13 wherein scanning the pattern of conductive material on each of said number of layers is used to record data regarding the pattern of conductive material on each of said number of layers to provides a pixel-by-pixel map of each of said number of layers.

15. The method of claim 5 wherein laser direct imaging is used with said corrected set of image data for each of the number of layers to manufacture copies of each of said number of layers.

16. The method of claim 14 wherein laser direct imaging is used to manufacture said repeated first layer.

17. A process for the fabrication of multilayer articles having features in register between at least a first layer and a second layer of the multilayer article, said process comprising the steps of:

a) using an initial set of image data describing at least two features on the first layer, forming said first layer having a pattern of said features thereon;

b) taking data of an image of the pattern of features on said first layer;

c) determining from the image of the pattern of features on said first layer that are to be in register with features on at least the second layer; and thereafter performing steps selected from the group consisting of:

I) modifying the initial set of image data for said first layer to make corrections for at least one feature within the pattern of features and producing a corrected set of image data;

II) modifying an initial set of data for at least said second layer having features within a pattern of features material that are to be in register with features on said first layer, said modifying being based upon a comparison of the initial set of image data for said second layer and image data taken in step b) of said first layer, and producing a corrected set of image data for said second layer;

III) modifying an initial set of data for a second layer having features within a pattern of features that are to be in register with features on another layer, said modifying being based upon a comparison of the initial set of image data for said second layer and image data taken of a manufactured second layer, and modifying the initial set of image data for said first layer to make corrections for at least one feature within the pattern of features, thereby producing a corrected set of data for at least said first layer and said second layer; and IV) modifying an initial set of data for a number of layers, each layer having features within a pattern of features that are to be connected to features on another layer, said modifying being based upon a comparison of initial sets of image data for each of said number of layers and image data taken of a manufactured layer for each of said number of layers, and modifying the initial set of image data for each of said number of layers to make corrections for at least one feature within a pattern of features within each of said number of layers, thereby producing a corrected set of image data for each of the number of layers; and then manufacturing at least one layer having features sites therein using a corrected set of data for manufacturing said at least one layer.

* * * * *